(12) United States Patent
Hirakawa et al.

(10) Patent No.: US 7,640,525 B2
(45) Date of Patent: Dec. 29, 2009

(54) ASSISTING PRINTED BOARD DESIGN PROCESS

(75) Inventors: Harunobu Hirakawa, Kanagawa (JP); Tetsuo Kon, Kanagawa (JP); Hideo Tani, Kanagawa (JP); Shigeru Isobe, Kanagawa (JP); Atsushi Hirano, Kanagawa (JP)

(73) Assignee: Ricoh Co., Ltd., Tokyo (JP)

( * ) Notice: Subject to any disclaimer, the term of this patent is extended or adjusted under 35 U.S.C. 154(b) by 363 days.

(21) Appl. No.: 11/377,580

(22) Filed: Mar. 17, 2006

(65) Prior Publication Data

US 2006/0225019 A1    Oct. 5, 2006

(30) Foreign Application Priority Data

Mar. 18, 2003    (JP)    ............... 2005-079673

(51) Int. Cl.
G06F 17/50 (2006.01)
(52) U.S. Cl. .................. 716/15; 716/4; 716/5
(58) Field of Classification Search ............ 716/4–5, 716/15
See application file for complete search history.

(56) References Cited

U.S. PATENT DOCUMENTS 6,496,957 B1 * 12/2002 Kumagai ............. 716/4
2001/0032222 A1    10/2001 Takahashi et al.

FOREIGN PATENT DOCUMENTS

| JP | 3067461 | 5/2000 |
| JP | 2000-285123 | 10/2000 |
| JP | 2001-282874 | 10/2001 |
| JP | 2002-297849 | 10/2002 |
| JP | 2004-220600 | 8/2004 |

* cited by examiner

Primary Examiner—Paul Dinh
(74) Attorney, Agent, or Firm—Oblon, Spivak, McClelland, Maier & Neustadt, L.L.P.

(57) ABSTRACT

An apparatus, method, system, computer program and product, each capable of assisting a printed board design process. A predetermined combination including information regarding at least two of a board material, board sheet, and a printed circuit board is prepared before performing the printed board design process.

20 Claims, 9 Drawing Sheets

| UNIT OUTLINE | SHEET OUTLINE | NO. OF LAYERS | MIN. LINE WIDTH | VIA DIAMETER | PCB CAPA-BILITY | RATING | SUPPLIER | UNIT COST | INITIAL COST | QUALITY | MOUNT-ING COST |
|---|---|---|---|---|---|---|---|---|---|---|---|
| | ☐ | 4L | 3 | MIDDLE | 500pin | | A | $@@ | $@@@ | 3 | $@@@ |
| | | | | | | | B | $@@ | $@@@ | 3 | $@@@ |
| | | | | | | | C | $@@ | $@@@ | 2 | $@@@ |
| | | 6L | | | 700pin | | A | $@@ | $@@@ | 3 | $@@@ |
| | | | | | | | B | $@@ | $@@@ | 3 | $@@@ |
| | | | | | | | C | $@@ | $@@@ | 2 | $@@@ |
| ☐ | ⊞ | 4L | | | 500pin | | A | $@@ | $@@@ | 3 | $@@@ |
| | | | | | | | B | $@@ | $@@@ | 3 | $@@@ |
| | | | | | | | C | $@@ | $@@@ | 2 | $@@@ |
| | | 6L | | | 700pin | | A | $@@ | $@@@ | 3 | $@@@ |
| | | | | | | | B | $@@ | $@@@ | 3 | $@@@ |
| | | | | | | | C | $@@ | $@@@ | 2 | $@@@ |
| | ⊞ | 4L | | | 500pin | | A | $@@ | $@@@ | 3 | $@@@ |
| | | | | | | | B | $@@ | $@@@ | 3 | $@@@ |
| | | | | | | | C | $@@ | $@@@ | 2 | $@@@ |
| | | 6L | | | 800pin | | A | $@@ | $@@@ | 3 | $@@@ |
| | | | | | | | B | $@@ | $@@@ | 3 | $@@@ |
| | | | | | | | C | $@@ | $@@@ | 2 | $@@@ |
| ☐ | ☐ | 4L | | | 600pin | | A | $@@ | $@@@ | 3 | $@@@ |

NO. OF LAYERS
- 1L ☐
- SILVER TH ☐
- 2L ☐
- 4L ☐
- 6L ☐
- 8L ☐
- 10L ☐

501 — MIN. LINE WIDTH
- 1 ☐
- 2 ☐
- 3 ☐
- 4 ☐
- 5 ☐

VIA DIAMETER
- NORMAL ☐
- MIDDLE ☐
- MINI ☐

502 — NO. OF COMPONENTS
- PART ☐
- PIN ☐
- NET ☐
- HOLE ☐

503 — MANU. METHOD
- MOLD ☐
- ROUTER ☐

NO. OF LAYERS
- 1L ☐
- SILVER TH ☐
- 2L ☐
- 4L ☑
- 6L ☑
- 8L ☐
- 10L ☐

501 — MIN. LINE WIDTH
- 1 ☐
- 2 ☐
- 3 ☑
- 4 ☐
- 5 ☐

VIA DIAMETER
- NORMAL ☐
- MIDDLE ☑
- MINI ☐

502 — NO. OF COMPONENTS
- PART 250
- PIN 600
- NET
- HOLE

503 — MANU. METHOD
- MOLD ☐
- ROUTER ☑

FIG. 6

| UNIT OUTLINE | SHEET OUTLINE | NO. OF LAYERS | MIN. LINE WIDTH | VIA DIAMETER | PCB CAPABILITY | RATING | SUPPLIER | UNIT COST | INITIAL COST | QUALITY | MOUNTING COST |
|---|---|---|---|---|---|---|---|---|---|---|---|
| □ | □ | 4L | 3 | MIDDLE | 500pin | 1 | A | $@@ | $@@ | 3 | $@@ |
| | | | | | | | B | $@@ | $@@ | 3 | $@@ |
| | | | | | | | C | $@@ | $@@ | 2 | $@@ |
| | | 6L | | | 700pin | 3 | A | $@@ | $@@ | 3 | $@@ |
| | | | | | | | B | $@@ | $@@ | 3 | $@@ |
| | | | | | | | C | $@@ | $@@ | 2 | $@@ |
| | ⊞ | 4L | | | 500pin | 1 | A | $@@ | $@@ | 3 | $@@ |
| | | | | | | | B | $@@ | $@@ | 3 | $@@ |
| | | | | | | | C | $@@ | $@@ | 2 | $@@ |
| | | 6L | | | 700pin | 3 | A | $@@ | $@@ | 3 | $@@ |
| | | | | | | | B | $@@ | $@@ | 3 | $@@ |
| | | | | | | | C | $@@ | $@@ | 2 | $@@ |
| | ⊞⊞ | 4L | | | 500pin | 1 | A | $@@ | $@@ | 3 | $@@ |
| | | | | | | | B | $@@ | $@@ | 3 | $@@ |
| | | | | | | | C | $@@ | $@@ | 2 | $@@ |
| | | 6L | | | 800pin | 4 | A | $@@ | $@@ | 3 | $@@ |
| | | | | | | | B | $@@ | $@@ | 3 | $@@ |
| | | | | | | | C | $@@ | $@@ | 2 | $@@ |
| □ | □ | 4L | | | 600pin | 2 | A | $@@ | $@@ | 3 | $@@ |

| UNIT OUTLINE | SHEET OUTLINE | NO. OF LAYERS | MIN. LINE WIDTH | VIA DIAMETER | PCB CAPABILITY | RATING | SUPPLIER | UNIT COST | INITIAL COST | QUALITY | MOUNTING COST |
|---|---|---|---|---|---|---|---|---|---|---|---|
| | □ | | | | | | | | | | |
| | ⊞ | | | | | | | | | | |
| □ | | | | | | | | | | | |
| | ⊞⊞ | | | | | | | | | | |
| | □ | | | | | | | | | | |
| □ | | | | | | | | | | | |

ASSISTING PRINTED BOARD DESIGN PROCESS

CROSS REFERENCE TO RELATED APPLICATIONS

This application is related to and claims priority under 35 U.S.C. §119 to Jap. Pat. Appl. No. 2005-079673, filed Mar. 18, 2003, the entire contents of which are hereby incorporated by reference.

FIELD OF THE INVENTION

The following disclosure relates generally to an apparatus, method, system, computer program and product, each capable of assisting a printed board design process.

DESCRIPTION OF THE RELATED ART

The printed board design process is a process of creating the blueprints, or artwork, for manufacture of a printed circuit board (PCB). As shown in FIG. 1B, one of the most important aspects of the printed board design process is to select a board material or a board sheet that can satisfy the design specification of the PCB ("the PCB design specification"). The selected board material or board sheet is then processed into one or more PCBs during the manufacturing process. For example, the dimensions of the PCB may be defined according to the circuit or layout of the PCB. The board material or board sheet is then selected based on the PCB with the defined dimensions. However, the board material selection or the board sheet selection can be cumbersome as a large number of combinations of the board material, board sheet, and PCB exist.

BRIEF SUMMARY OF THE INVENTION

In light of the above-described and other problems, there is a need for a printed board design process capable of selecting a board material or a board sheet in a more efficient manner. Further, the board material selection or the board sheet selection should be made in a more comprehensive and systematic manner to address various factors other than the PCB design specification, including cost, performance, time-to-market, availability, customer needs, in-house or outside standards, environmental impacts, etc.

Exemplary embodiments of the present invention include an apparatus, method, system, computer program and product, each capable of assisting a printed board design process.

In one example, board library information including a plurality of predetermined combinations is prepared. Each one of the plurality of predetermined combinations may include information regarding at least two of a board material, a board sheet, and a printed circuit board. Once a design specification of the printed circuit board is input, at least one predetermined combination may be selected from the board library information, which satisfies at least one item of the design specification.

In another example, board library information including a plurality of predetermined combinations and PCB information corresponding to the board library information are prepared in a corresponding manner. Each one of the plurality of predetermined combinations may include information regarding at least two of a board material, a board sheet, and a printed circuit board. The board library information may include a set of items for each one of the plurality of predetermined combinations. Once a design specification of the printed circuit board is input, at least one predetermined combination may be selected from the board library information, which satisfies at least one item of the design specification.

It is to be understood that both the foregoing general description of the invention and the following detailed description are exemplary, but are not restrictive.

BRIEF DESCRIPTION OF THE DRAWINGS

A more complete appreciation of the disclosure and many of the attendant advantages thereof will be readily obtained as the same becomes better understood by reference to the following detailed description of exemplary embodiments when considered in connection with the accompanying drawings, wherein.

DETAILED DESCRIPTION OF THE INVENTION

In describing the exemplary embodiments illustrated in the drawings, specific terminology is employed for clarity. However, the disclosure of this patent specification is not intended to be limited to the specific terminology selected and it is to be understood that each specific element includes all technical equivalents that operate in a similar manner. Referring now to the drawings, wherein like reference numerals designate identical or corresponding parts throughout the several views, FIG. 1A illustrates an exemplary printed board design process, which may be performed before a process of manufacturing or producing a printed circuit board.

Figure 1A:
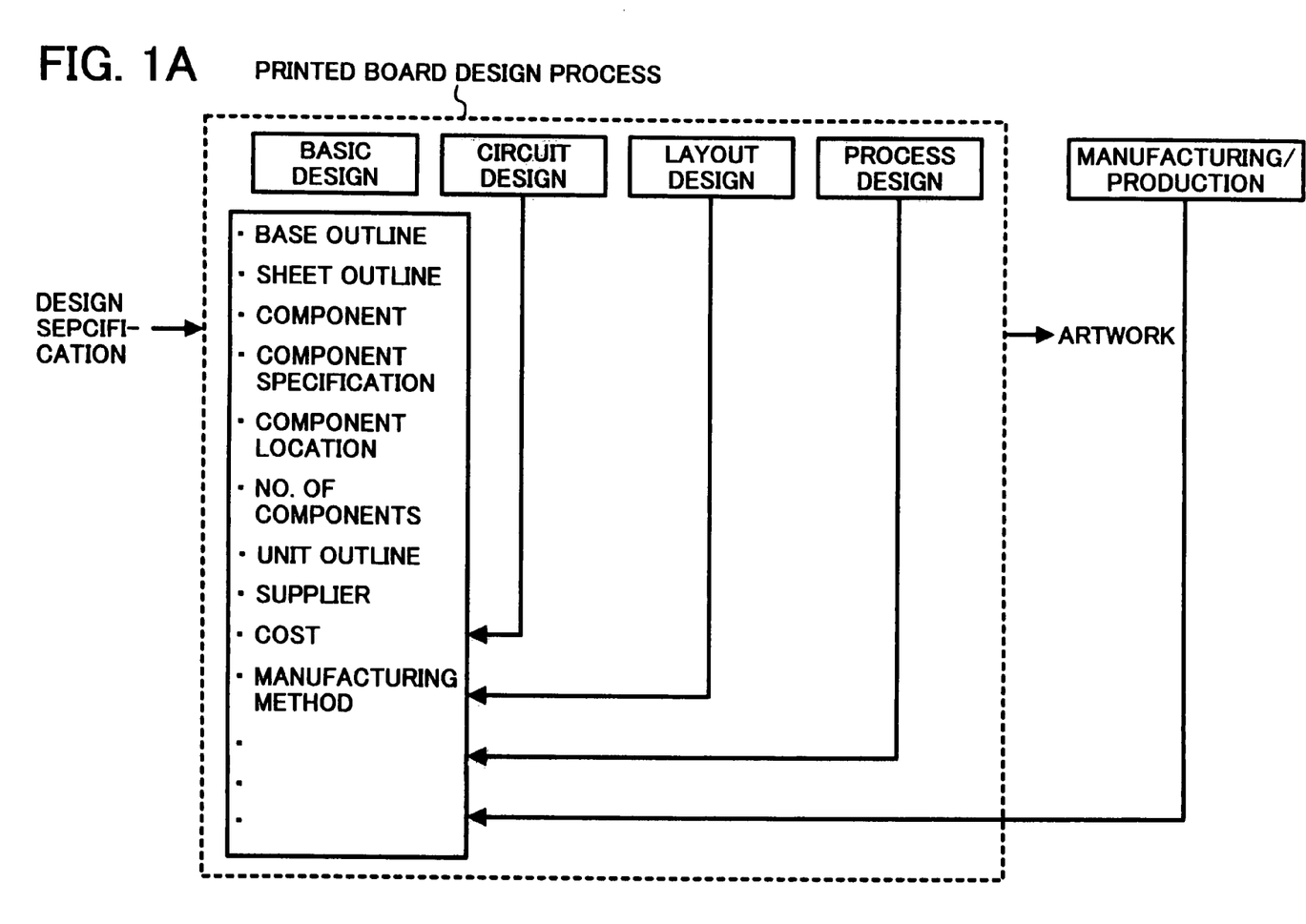
FIG. 1A is a block diagram illustrating a printed board design process according to an exemplary embodiment of the present invention.
Figure 1B:
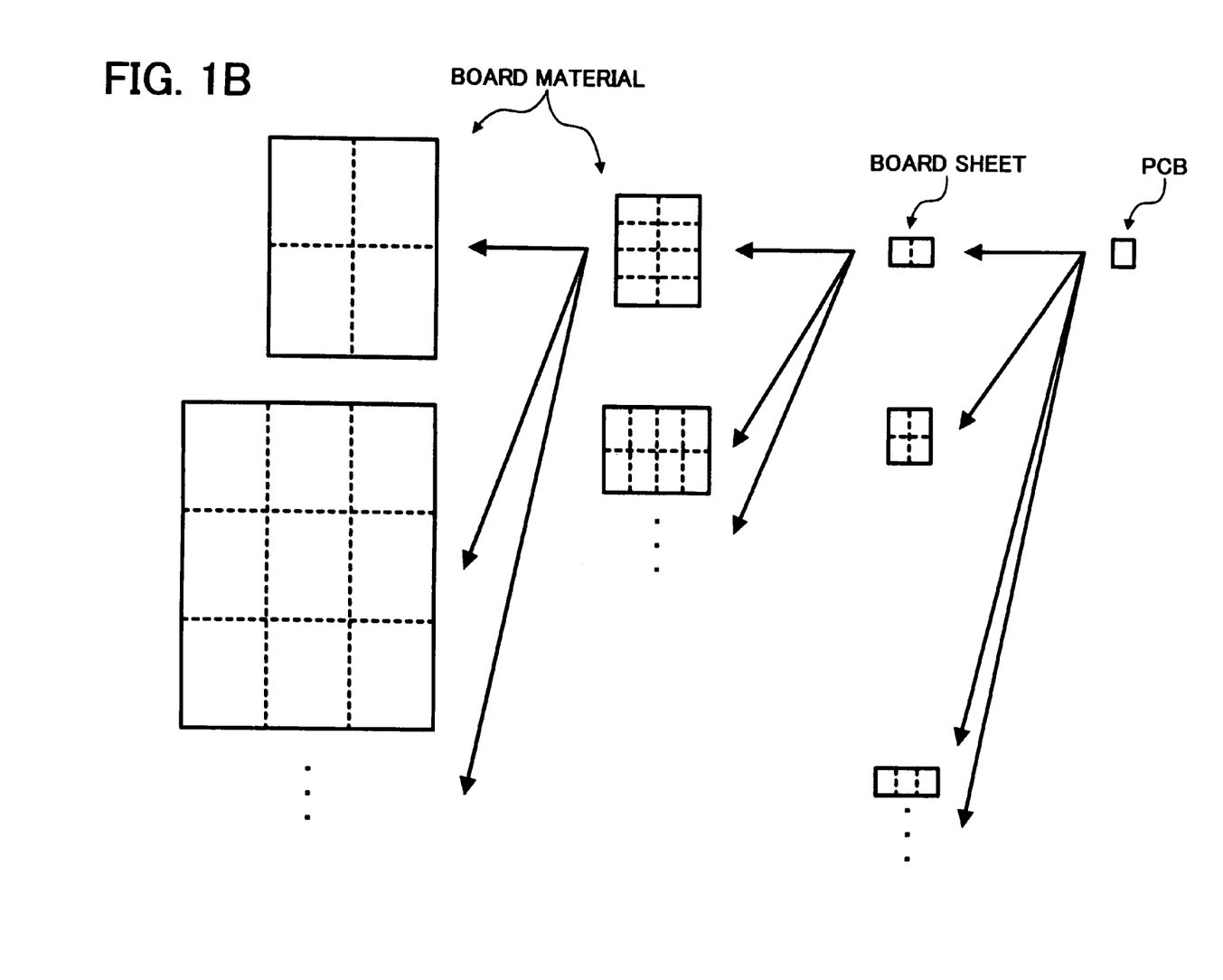
FIG. 1B is an illustration for explaining the relationship of a board material, board sheet, and PCB.

As shown in FIG. 1A, the printed board design process creates the blueprints, such as artwork, to be used for the manufacture/production process based on the PCB design specification. The printed board design process may be performed in several stages including a basic design stage, a circuit design stage, a layout design stage, and a process design stage. In addition to the stages shown in FIG. 1A, the printed board design process may include other stages such as a verification process, for example.

As illustrated in FIG. 1A, the basic design stage at least performs the board material selection or the board sheet selection described above referring to FIG. 1B, while considering various factors addressed by a whole process of the PCB. The factors, which may be considered at the basic design stage include, but are not limited to, the outline of the board material ("base outline") such as the dimensions, orientation, size or shape of the board material, the outline of the board sheet ("sheet outline") such as the dimensions, orientation, size or shape of the board sheet, the components to be mounted on the board or any information regarding the components including the specification of each component ("component specification"), the location of the components including the interconnections between the components, the number of components, the outline of the PCB ("unit outline") such as the dimensions, orientation, size or shape of the PCB, the potential suppliers of the board material or the components, various costs associated with the whole PCB process, and potential PCB manufacturing methods. With these factors that broadly reflect the whole PCB process, the board material or board sheet suitable for the PCB design specification may be selected in an efficient manner at the early stage of the printed board design process.

Figure 2:
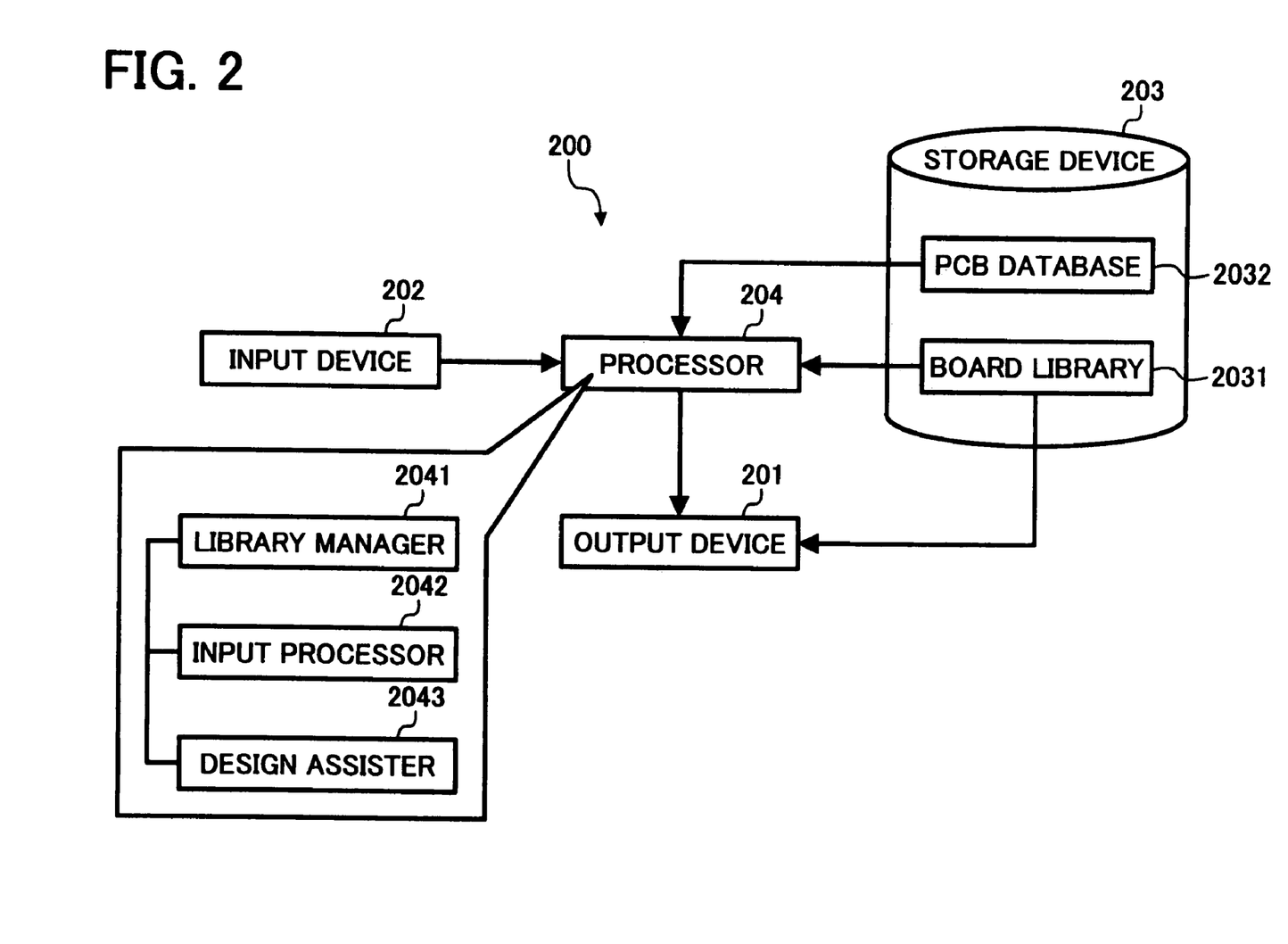
FIG. 2 is a schematic block diagram illustrating the structure of a board design aid system according to an exemplary embodiment of the present invention.

To facilitate the printed board design process of FIG. 1A, any kind of computer system may be introduced, such as a board design aid system 200 shown in FIG. 2. The board design aid system 200 is capable of assisting a user in the board material selection or the board sheet selection. As shown in FIG. 2, the board design aid system 200 includes an output device 201, an input device 202, a storage device 203, and a processor 204.

The output device 201 includes any kind of device capable of outputting various data to a user, such as a display device including a liquid crystal display (LCD), or a printing device including a printer, for example. The input device 202 includes any kind of user interface, which allows the user to input various data, such as a keyboard, mouse, or pen, for example. Any one of the output device 201 and the input device 202 may be provided separately from other devices of the board design aid system 200, as long as it is accessible from the processor 204.

The processor 204 includes any kind of processor capable of controlling operation of the board design aid system 200, such as a central processing unit (CPU), for example. As shown in FIG. 2, the processor 204 includes a library manager 2041, an input processor 2042, and a design assister 2043.

The storage device 203 includes any kind of memory or storage device, capable of storing various kinds of data, such as a read only memory (ROM), a random access memory (RAM), a hard disk drive (HDD), etc. Further, in this example, the storage device 203 may include any kind of removable medium, or any kind of medium reading device capable of reading data from the removable medium. Furthermore, the storage device 203 may be provided separately from any one of the output device 201, the input device 202, and the processor 204, as long as it is accessible from the processor 204.

In this example, as illustrated in FIG. 2, the storage device 203 includes a board library 2031 and a PCB database 2032. The board library 2031 stores one or more predetermined combinations as board library information. Each one of the predetermined combinations includes information regarding at least two of the board material, board sheet, and unit PCB. The board library 2031 may be previously created using the library manager 2041. Alternatively, the board library 2031 may be downloaded from any other device or apparatus onto the storage device 203. Alternatively, the board library 2031 stored in the storage device 203 may be uploaded to any other device or apparatus.

In one example, the board library 2031 may store at least one predetermined combination of the base outline and the unit outline. Since a large number of base outlines are available in the market, selecting the base outline that corresponds to the unit outline can be cumbersome. In order to facilitate the board material selection, one or more combinations of the base outline and the unit outline, which are considered by the user as optimal, may be previously obtained. For example, the unit outline of the PCB that can be taken out from the board material in a most cost efficient manner may be previously obtained for each one of the base outlines available in the market. The obtained combinations of the base outline and the unit outline are stored in the storage device 203 as the board library information.

Alternatively, any other kind of information may be stored as the board library information as long as it can indicate a predetermined combination of at least two of the board material, the board sheet, and the PCB. For example, the board library 2031 may store at least one predetermined combination of the sheet outline and the unit outline as the board library information. In another example, the board library 2031 may store at least one predetermined combination of the base outline and the sheet outline as the board library information. In another example, the board library 2031 may store at least one predetermined combination of the base outline, the sheet outline, and the unit outline, as the board library information.

Still referring to FIG. 2, the PCB database 2032 stores information ("PCB information") other than the information stored as the board library information for each one of the predetermined combinations of the board library information. The PCB information includes a set of items for each one of the predetermined combinations, each set having information regarding the PCB or the whole PCB process that is presumed to be obtained when the corresponding predetermined combination is selected. Examples of the items of the PCB information include, but are not limited to, the specification of the PCB ("PCB specification") such as the number of layers, the line width, the via diameter, etc., the quality of the PCB, the PCB capability such as the maximum number of pins mountable, the costs associated with the PCB process such as the PCB initial cost, the PCB unit cost, or the cost required for mounting the components, and the supplier of the board material.

Figure 3:
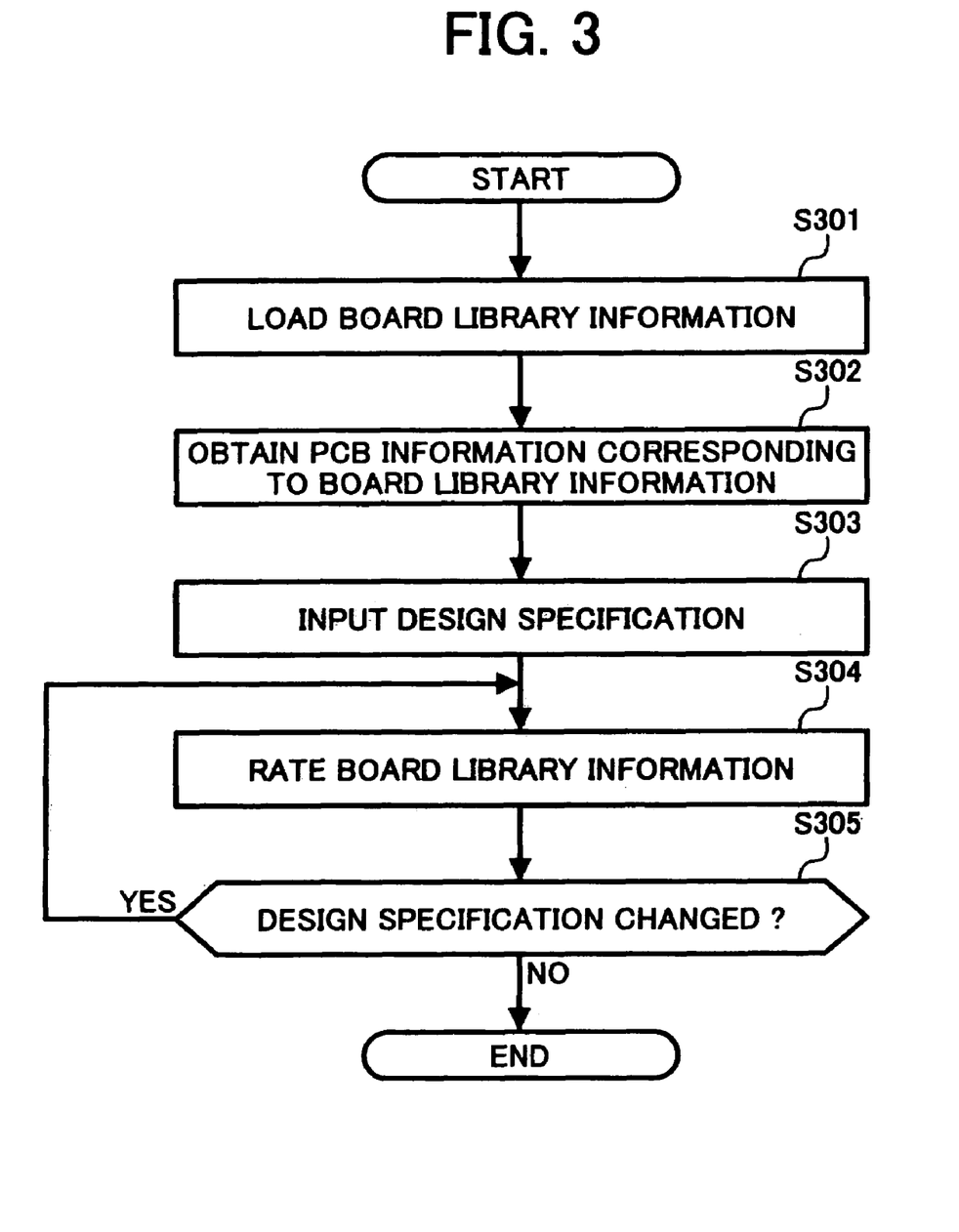
FIG. 3 is a flowchart illustrating operation of assisting a user in the printed board design process according to an exemplary embodiment of the present invention.

Referring now to FIG. 3, operation of assisting the printed board design process, performed by the board design aid system 200, is explained according to an exemplary embodiment of the present invention.

In Step S301, the library manager 2041 loads the board library information from the board library 2031 of the storage device 203. In this example, the library manager 2041 loads a list of the predetermined combinations of the sheet outline and the unit outline.

In Step S302, the library manager 2041 may obtain the PCB information from the PCB database 2032, which corresponds to the board library information loaded in the previous step. The board library information and the PCB information may be displayed by the output device 201 as a PCB table.

Figure 4:
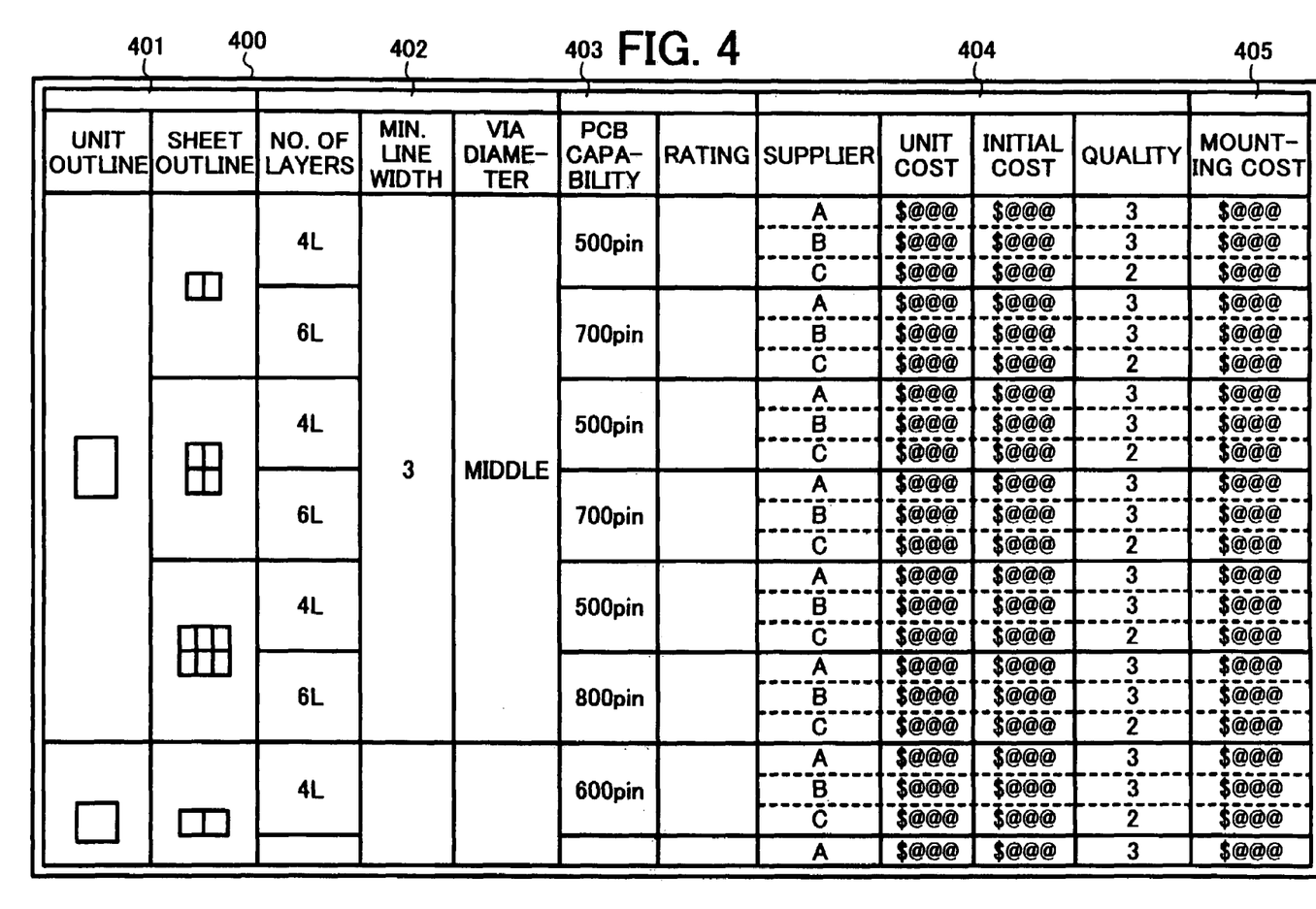
FIG. 4 is an illustration of an exemplary table displayed by the board design aid system of FIG. 2.

For example, a PCB table 400 shown in FIG. 4 may be generated, which lists, in a corresponding manner, the board library information in a first section 401; the PCB specification including the number of layers, the minimum line width, and the via diameter in a second section 402; the PCB capability in a third section 403; the supplier of the board material, the PCB unit cost, the PCB initial cost, and the PCB quality in a fourth section 404; and the cost required for mounting in a fifth section 405. The third section 402 of the PCB table 400 further includes a column of blank spaces under the heading "rating". Although the PCB table 400 of FIG. 4 displays information regarding the board library information having the number of layers of 4 or 6, the table may display information regarding the board library information having any number of layers.

Figure 5A:
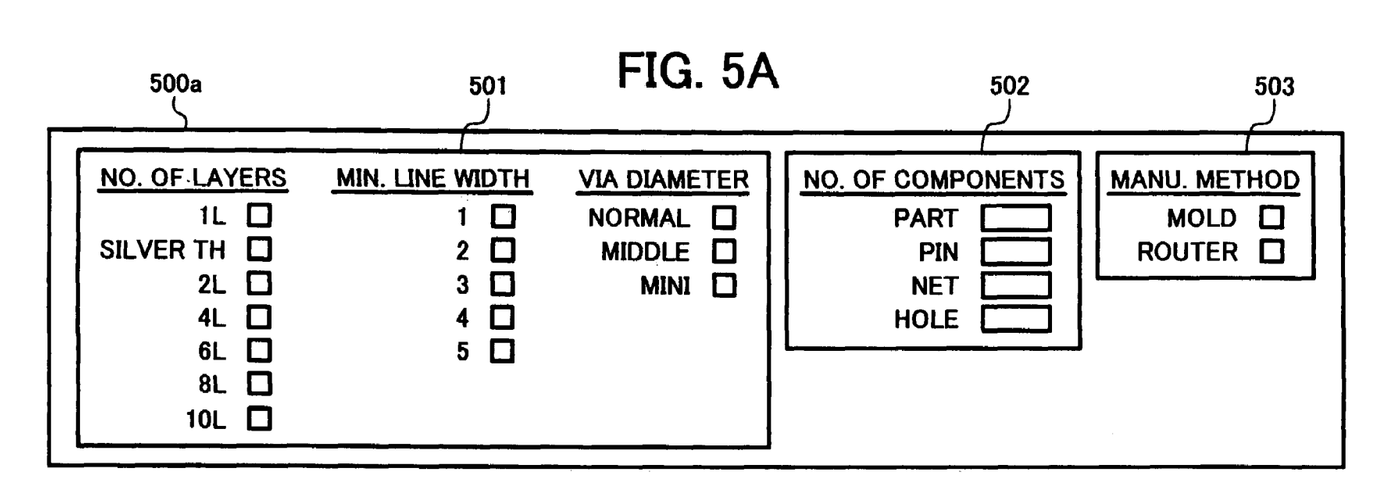
FIG. 5A is an illustration of an exemplary screen displayed by the board design aid system of FIG. 2.

In Step S303, the input processor 2042 requests the user to input a PCB design specification. For example, the output device 201 may display a window 500*a* shown in FIG. 5A, which requests the user to input information describing the PCB design specification. Referring to FIG. 5A, the user may be asked to input information regarding a PCB specification such as a number of layers, a minimum line width, or a via diameter type in a first section 501; layout information such as a number of parts, a number of pins, a number of nets, or a number of holes in a second section 502; and a PCB manufacturing method indicating whether to use a mold or a router in a third section 503. Once the window 501*a* is displayed, the user may input information using the input device 202, to produce for example, the entries illustrated in FIG. 5B. The input information is received by the input processor 2042.

In Step S304, the design assister 2043 determines whether each one of the predetermined combinations of the sheet outline and the unit outline listed in the PCB table satisfies at least one item of the PCB design specification obtained by the input processor 2042. In this example, the design assister 2043 assigns rating to each one of the predetermined combinations, which indicates whether or not the PCB design specification is satisfied. The rating may further indicate the degree of satisfaction.

Figure 5B:
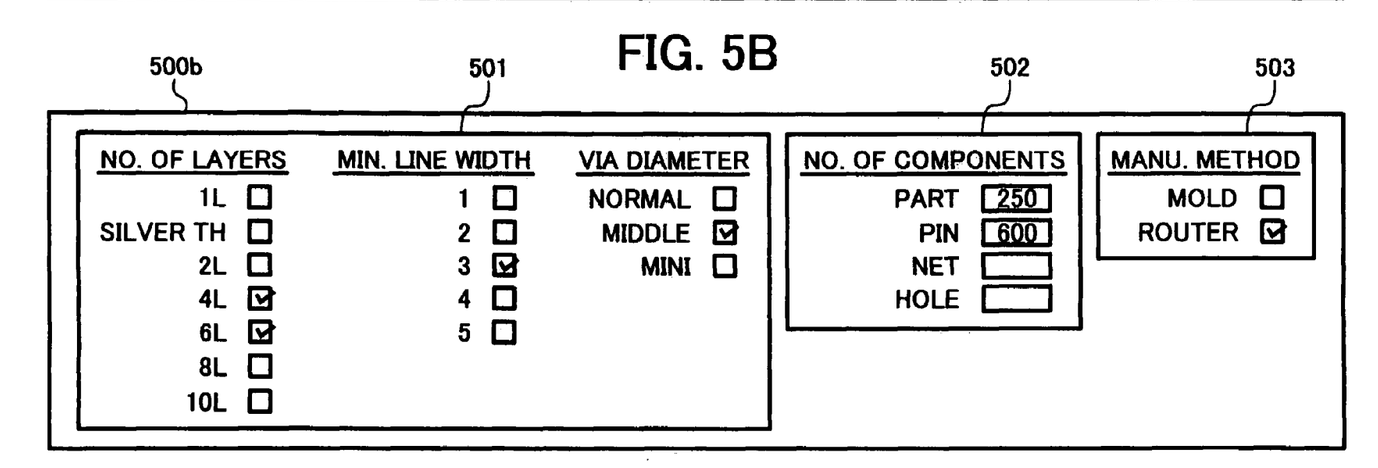
FIG. 5B is an illustration of an exemplary screen displayed by the board design aid system of FIG. 2.
Figure 6:
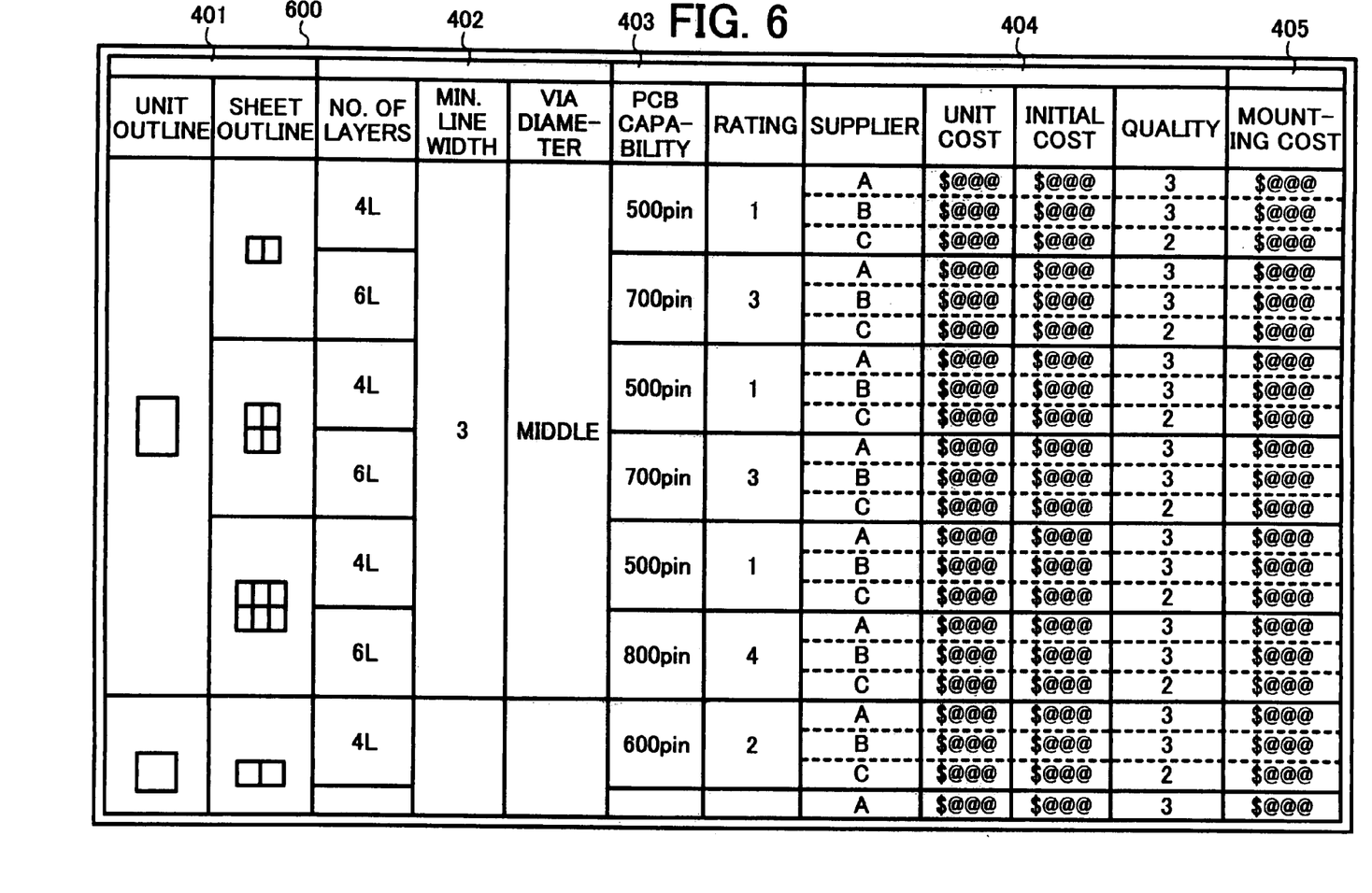
FIG. 6 is an illustration of an exemplary table displayed by the board design aid system of FIG. 2.

For example, the design assister 2043 assigns a rating to each one of the predetermined combinations listed in the PCB table 400 of FIG. 4, by comparing the information of the PCB table 400 and the PCB design specification of FIG. 5B. In this example, the PCB capability indicating the number of components mountable on the PCB is compared with the layout information indicating the number of components to be mounted. Once the rating is assigned, the design assister 2043 causes the library manager 2041 to update information of the PCB table 400. More specifically, the library manager 2041 adds information regarding the rating to the column of the blank spaces of FIG. 4 for display, as illustrated in FIG. 6. Referring to FIG. 6, the rating of 1 is assigned to the combination, which does not satisfy the PCB design specification. The rating of 2 is assigned to the combination, which satisfies the PCB design specification. The rating of 3 is assigned to the combination, which sufficiently satisfies the PCB design specification. The rating of 4 is assigned to the combination, which most sufficiently satisfies the PCB design specification.

By analyzing information of the PCB table 600, the user can select a board sheet that satisfies the PCB design specification of FIG. 5B, while considering various factors that reflect the whole PCB process, such as the costs and the supplier, for example. The user may further change the PCB design specification by reentering information in the window of FIG. 5B to see different results.

In Step S305, the input processor 2042 determines whether any information regarding the PCB design specification is changed. If information is changed ("YES" in Step S305), the operation returns to Step S304 to obtain rating. If no information is changed ("NO" in Step S305), the operation ends, assuming that the board sheet selection is completed.

The operation of FIG. 3 may be performed in various other ways. In one example, the steps illustrated in FIG. 3 may be performed in different orders. In another example, the operation of FIG. 3 may include the additional step of extracting the predetermined combinations having the rating higher than 2, for example, before updating the PCB table. In another example, in Step S304, the design assister 2043 may rate in other various ways, for example, according to the user's preference. In another example, any other kind of board library information may be loaded in Step S301 to assist the board material selection or the board sheet selection.

Figure 7:
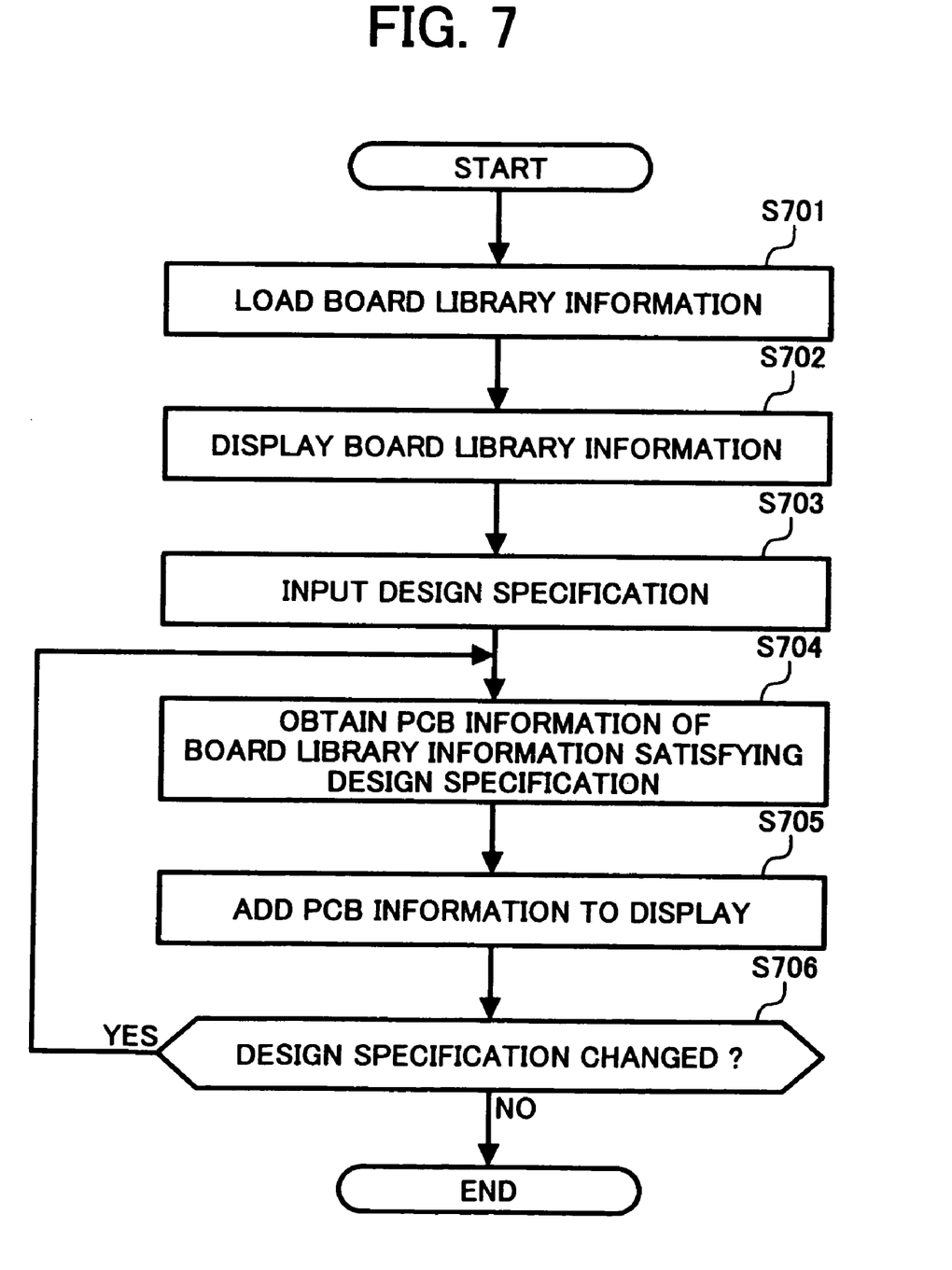
FIG. 7 is a flowchart illustrating operation of assisting a user in the printed board design process according to an exemplary embodiment of the present invention.

Referring now to FIG. 7, operation of assisting the printed board design process, performed by the board design aid system 200, is explained according to another exemplary embodiment of the present invention.

In Step S701, the library manager 2041 loads the board library information from the board library 2031 of the storage device 203. In this example, a list of the predetermined combinations of the sheet outline and the unit outline is loaded.

In Step S702, the library manager 2041 may cause the output device 201 to display the board library information as a PCB table.

Figure 8:
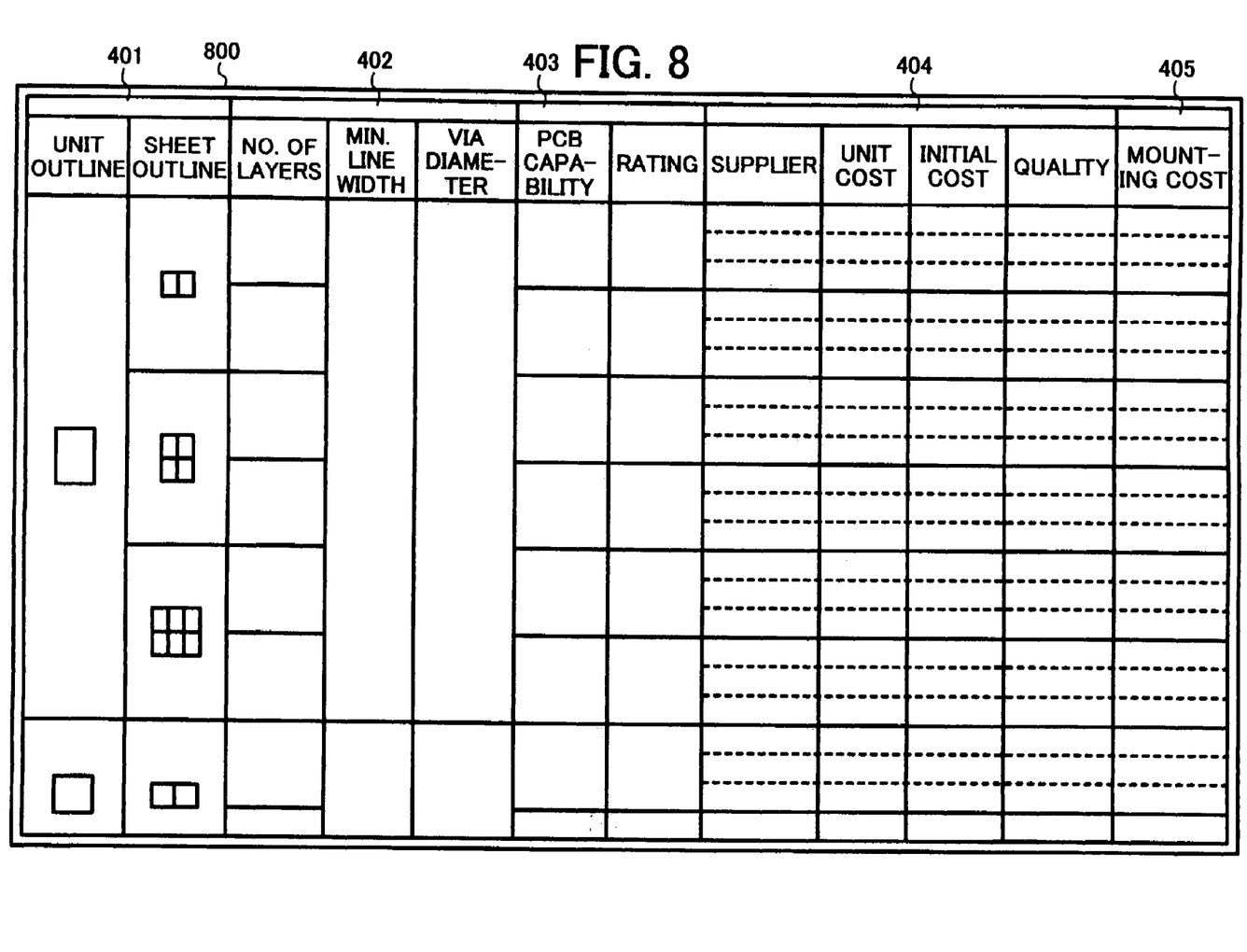
FIG. 8 is an illustration of an exemplary table displayed by the board design aide system of FIG. 2.

For example, a PCB table 800 shown in FIG. 8 may be generated, which lists the predetermined combinations of the sheet outline and the unit outline in the first section 401. The PCB table 800 may further include a plurality columns of blank spaces.

In Step S703, the input processor 2042 requests the user to input the PCB design specification in a substantially similar manner as described referring to Step S303 of FIG. 3.

In Step S704, the design assister 2043 obtains, from the PCB database 2032, at least one item of the PCB information corresponding to the board library information loaded in the previous step that satisfies at least one item of the PCB design specification obtained by the input processor 2042. More specifically, in this example, the design assister 2043 obtains the PCB capability, the rating, the supplier of the board material, the PCB unit cost, the PCB initial cost, the PCB quality, and the PCB cost for mounting, of one or more predetermined combinations that satisfy the PCB design specification.

In Step S705, the library manager 2041 updates the PCB table by adding the PCB information obtained by the design assister 2043. For example, the PCB table 800 of FIG. 8 may be updated to generate the PCB table 600 of FIG. 6. In a substantially similar manner as described referring to FIG. 3, the user can select a board sheet that satisfies the PCB design specification, while considering various factors that reflect the whole PCB process.

In Step S706, the input processor 2042 determines whether any information regarding the PCB design specification is changed. If information is changed ("YES" in Step S706), the operation returns to Step S704 to obtain the PCB information. If no information is changed ("NO" in Step S706), the operation ends, assuming that the board sheet selection is completed.

The operation of FIG. 7 may be performed in various other ways. In one example, the steps illustrated in FIG. 7 may be performed in different orders. In another example, the operation of FIG. 7 may include the additional step of extracting the predetermined combinations having the rating higher than 2, for example, before updating the PCB table. In another example, any other kind of board library information may be loaded in Step S701 to assist the board material selection or the board sheet selection.

In another example, Step S704 may be performed in two steps including a first step of obtaining at least one predetermined combination of the sheet outline and the unit outline that satisfies at least one item of the PCB design specification, and a second step of obtaining at least one item of the PCB information corresponding to the at least one predetermined combination that is obtained by the first step. Upon completion of the first step, the PCB table including the at least one predetermined combination obtained by the first step may be displayed in a corresponding manner with the design specification.

Numerous additional modifications and variations are possible in light of the above teachings. It is therefore to be understood that within the scope of the appended claims, the disclosure of this patent specification may be practiced in ways other than those specifically described herein.

For example, elements and/or features of different illustrative embodiments may be combined with each other and/or substituted for each other within the scope of this disclosure and appended claims.

In one example, the board library 2031 of FIG. 2 and the PCB database 2032 of FIG. 2 may be combined together into one database. With this structure, the board library information and the PCB information can be stored in a corresponding manner. In another example, the board design aid system 200 of FIG. 2 may be combined with any kind of apparatus or system.

In another example, any kind of rating systems may be applied depending on the user's preference. Further, any one of the PCB tables created by the board design aid system 200 of FIG. 2 may be adjusted according to the user's preference. For example, the user may sort any one of the PCB tables.

In another example, the predetermined combination of the board library information may include information other than the information regarding at least one of the board material, the board sheet, and the printed circuit board. For example, the predetermined combination of the board library information may include information regarding a first board and a second board each of which is used during the PCB process, as long as the second board can be taken out from the first board.

Furthermore, as described above, any one of the above-described and other methods of the present invention may be embodied in the form of a computer program stored in any kind of storage medium. Examples of storage mediums include, but are not limited to, flexible disk, hard disk, optical discs, magneto-optical discs, magnetic tapes, involatile memory cards, ROM (read-only-memory), etc. The computer program may be downloaded from or uploaded to any kind of storage device via network.

Alternatively, any one of the above-described and other methods of the present invention may be implemented by ASIC, prepared by interconnecting an appropriate network of conventional component circuits or by a combination thereof with one or more conventional general purpose microprocessors and/or signal processors programmed accordingly.

The invention claimed is:

1. A system for assisting a printed circuit board design process, comprising:
a storage device configured to store board library information related to board material supplied from providers of the board material, the supplied board material to be divided into at least one board sheet for division into at least one printed circuit board, said board library information comprising a plurality of predetermined combinations, each combination including information regarding at least two of the supplied board material, the board sheet, and the printed circuit board;
an input device configured to input a design specification of the printed circuit board; and
a processor configured to 1) obtain, from the storage device, at least one of the plurality of predetermined combinations that satisfies the design specification, as selected board library information and 2) produce a numerical rating among various board materials correlating a degree of satisfaction of the supplied board material to the design specification of the printed circuit board.

2. The system of claim 1, further comprising:
an output device configured to output the selected board library information.

3. The system of claim 1, wherein the storage device further stores:
PCB information in a corresponding manner with the board library information, wherein the PCB information comprises a plurality set of items, each set of items including information regarding each one of the plurality of predetermined combinations of the board library information.

4. The system of claim 3, wherein the processor is further configured to obtain, from the storage device, at least one of the plurality set of items of the PCB information that corresponds to the selected board library information, as selected PCB information.

5. The system of claim 4, further comprising:
an output device configured to output in a corresponding manner the selected board library information and the selected PCB information.

6. The system of claim 3, wherein:
the design specification of the printed circuit board includes information regarding a desired number of pins;
the PCB information includes information regarding a number of pins for each one of the plurality of predetermined combinations of the board library information; and
the rating is determined based on comparison between the information regarding a desired number of pins obtained from the design specification and the information regarding a number of pins obtained from the PCB information.

7. The system of claim 4, wherein the rating indicates whether the selected board library information satisfies the design specification.

8. The system of claim 7, wherein the rating is configured to further indicate the degree of satisfaction.

9. The system of claim 8, wherein the rating is determined based on comparison between the design specification and the selected PCB information.

10. The system of claim 1, wherein the information regarding at least two of the board material, the board sheet, and the printed circuit board includes information regarding at least two of an outline of the board material, an outline of the board sheet, and an outline of the printed circuit board.

11. The system of claim 7, wherein the design specification includes a plurality of design specification items, and wherein the processor is further configured to select at least one of the plurality of predetermined combinations having a rating higher than a predetermined value so as to obtain at least one of plurality of predetermined combinations that satisfies all of the plurality of design specification items for output.

12. A system for assisting a printed circuit board design process, comprising:
a storage device configured to store 1) board library information related to board material supplied from providers of the board material, the supplied board material to be divided into at least one board sheet for division into at least one printed circuit board and 2) PCB information, wherein the board library information comprises a plurality of predetermined combinations each combination including information regarding at least two of the supplied board material, the board sheet, and the printed circuit board, and wherein the PCB information comprises a plurality set of items each set of items including information regarding each one of the plurality of predetermined combinations of the board library information and a processor configured to 1) obtain the board library information and the PCB information from the storage device and 2) produce a numerical rating among various board materials correlating a degree of satisfaction of the supplied board material to the design specification of the printed circuit board.

13. The system of claim 12, wherein the board library information is determined according to the user's preference.

14. The system of claim 12, further comprising: an input device configured to input a design specification of the printed circuit board, wherein the processor is further configured to assign said rating to each one of the plurality of predetermined combinations of the board library information to indicate whether each one of the plurality of predetermined combinations satisfies the design specification.

15. The system of claim 14, wherein the rating is determined based on comparison between the design specification and the PCB information that corresponds to each one of the plurality of predetermined combinations.

16. A method for assisting a printed circuit board design process, comprising:

storing by a computer 1) board library information related to board material supplied from providers of the board material, the supplied board material to be divided into at least one board sheet for division into at least one printed circuit board and 2) PCB information, wherein the board library information comprises a plurality of predetermined combinations each combination including information regarding at least two of the supplied board material, the board sheet, and the printed circuit board, and wherein the PCB information comprises a plurality set of items each set of items including information regarding each one of the plurality of predetermined combinations of the board library information;

inputting to the computer a design specification of the printed circuit board;

obtaining at least one of the plurality of predetermined combinations that satisfies the design specification, as selected board library information;

outputting at least one of the plurality set of items of the PCB information that corresponds to the selected board library information, in a corresponding manner with the design specification and the selected board library information; and producing by the computer a numerical rating among various board materials correlating a degree of satisfaction of the supplied board material to the design specification of the printed circuit board.

17. The method of claim 16, further comprising:
determining whether the design specification input by the inputting step is changed to generate a determination result, wherein the obtaining step and the outputting step are repeated based on the determination result.

18. A method for assisting a printed board design process, comprising:

storing by a computer board library information related to board material supplied from providers of the board material, the supplied board material to be divided into at least one board sheet for division into at least one printed circuit board, said board library information comprising a plurality of predetermined combinations each combination including information regarding at least two of the supplied board material, the board sheet, and the printed circuit board;

inputting to the computer a design specification of the printed circuit board;

obtaining at least one of the plurality of predetermined combinations that satisfies the design specification, as selected board information;

outputting the selected board information in a corresponding manner with the design specification; and producing by the computer a numerical rating among various board materials correlating a degree of satisfaction of the supplied board material to the design specification of the printed circuit board.

19. The method of claim 18, further comprising:
determining whether the design specification input by the inputting step is changed to generate a determination result, wherein the obtaining step and the outputting step are repeated based on the determination result.

20. A computer readable medium storing computer instructions for performing a method of assisting a printed board design process, the method comprising:

storing board library information related to board material supplied from providers of the board material, the supplied board material to be divided into at least one board sheet for division into at least one printed circuit board, said board library information comprising a plurality of predetermined combinations each combination including information regarding at least two of the supplied board material, the board sheet, and the printed circuit board;

inputting a design specification of the printed circuit board;

obtaining at least one of the plurality of predetermined combinations of the board library information, which satisfies at least one item of the design specification, as selected board library information; and producing a numerical rating among various board materials correlating a degree of satisfaction of the supplied board material to the design specification of the printed circuit board.

* * * * *

UNITED STATES PATENT AND TRADEMARK OFFICE
CERTIFICATE OF CORRECTION

| | | |
|---|---|---|
| PATENT NO. | : 7,640,525 B2 | Page 1 of 1 |
| APPLICATION NO. | : 11/377580 | |
| DATED | : December 29, 2009 | |
| INVENTOR(S) | : Hirakawa et al. | |

It is certified that error appears in the above-identified patent and that said Letters Patent is hereby corrected as shown below:

On the title page, Item (30), the Foreign Application Priority Data is incorrect. Item (30) should read:

-- (30)           Foreign Application Priority Data

Mar. 18, 2005   (JP) ................................ 2005-079673 --

Signed and Sealed this

Sixteenth Day of February, 2010

David J. Kappos
*Director of the United States Patent and Trademark Office*